(12) United States Patent
Ge et al.

(10) Patent No.: US 9,748,285 B2
(45) Date of Patent: Aug. 29, 2017

(54) MANUFACTURE METHOD OF DUAL GATE OXIDE SEMICONDUCTOR TFT SUBSTRATE AND STRUCTURE THEREOF

(71) Applicant: Shenzhen China Star Optoelectronics Technology Co., Ltd., Shenzhen (CN)

(72) Inventors: Shimin Ge, Shenzhen (CN); Hejing Zhang, Shenzhen (CN); Chihyuan Tseng, Shenzhen (CN); Chihyu Su, Shenzhen (CN); Wenhui Li, Shenzhen (CN); Longqiang Shi, Shenzhen (CN); Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 119 days.

(21) Appl. No.: 14/770,470

(22) PCT Filed: May 21, 2015

(86) PCT No.: PCT/CN2015/079457
§ 371 (c)(1),
(2) Date: Aug. 26, 2015

(87) PCT Pub. No.: WO2016/165184
PCT Pub. Date: Oct. 20, 2016

(65) Prior Publication Data
US 2017/0141141 A1    May 18, 2017

(30) Foreign Application Priority Data

Apr. 14, 2015  (CN) .......................... 2015 1 0175517

(51) Int. Cl.
*H01L 21/00* (2006.01)
*H01L 29/786* (2006.01)
(Continued)

(52) U.S. Cl.
CPC .... *H01L 27/1288* (2013.01); *H01L 21/02565* (2013.01); *H01L 21/02631* (2013.01);
(Continued)

(58) Field of Classification Search
CPC ............. H01L 29/7869; H01L 27/1225; H01L 29/78648; H01L 27/124; H01L 27/1251;
(Continued)

(56) References Cited

U.S. PATENT DOCUMENTS 8,188,477 B2 * 5/2012 Miyairi ............... H01L 27/1225
257/258
8,319,215 B2 * 11/2012 Yamazaki ........... H01L 27/1225
257/43
(Continued)

*Primary Examiner* — Bradley K Smith
*Assistant Examiner* — David Goodwin
(74) *Attorney, Agent, or Firm* — Leong C. Lei

(57) ABSTRACT

The present invention provides a manufacture method of an oxide semiconductor TFT substrate and a structure thereof. The manufacture method of the dual gate oxide semiconductor TFT substrate utilizes the halftone mask to implement one photo process, which cannot only accomplish the patterning to the oxide semiconductor layer but also obtain the oxide conductor layer (53') with ion doping process; the method implements the patterning process to the bottom gate isolation layer (31) and the top gate isolation layer (32) at the same time with one photo process; the method implements patterning process to the second, third metal layers at the same time to obtain the first source (81), the first drain (82), the second source (83), the second drain (84), the first top gate (71) and the second top gate (72) with one photo process; the method implements patterning process to the second flat layer (9), the passivation layer (8) and the top gate isolation layer (32) at the same time with one photo process, to reduce the number of the photo processes to nine for effectively simplifying the manufacture process, raising the production efficiency and lowering the production cost.

11 Claims, 9 Drawing Sheets

(51) Int. Cl.
  *H01L 27/12*   (2006.01)
  *H01L 21/02*   (2006.01)
  *H01L 29/24*   (2006.01)
  *H01L 29/49*   (2006.01)
  *H01L 27/32*   (2006.01)

(52) U.S. Cl.
  CPC ........ *H01L 27/127* (2013.01); *H01L 27/1225* (2013.01); *H01L 29/24* (2013.01); *H01L 29/4908* (2013.01); *H01L 29/7869* (2013.01); *H01L 29/78648* (2013.01); *H01L 27/3262* (2013.01)

(58) Field of Classification Search
  CPC ........... H01L 21/02565; H01L 21/0274; H01L 27/1259
  See application file for complete search history.

(56) References Cited

U.S. PATENT DOCUMENTS

| | | | |
|---|---|---|---|
| 9,324,874 B2* | 4/2016 | Yamazaki | H01L 27/1225 |
| 9,543,442 B2* | 1/2017 | Ge | G02F 1/13439 |
| 2013/0264564 A1* | 10/2013 | Park | H01L 29/7869 257/43 |
| 2015/0123084 A1* | 5/2015 | Kim | H01L 27/326 257/40 |
| 2015/0206950 A1* | 7/2015 | Chen | H01L 29/7869 257/43 |
| 2016/0163745 A1* | 6/2016 | Choi | H01L 27/1251 257/40 |
| 2016/0293643 A1* | 10/2016 | Kim | H01L 27/1248 |
| 2016/0307932 A1* | 10/2016 | Ge | H01L 21/02565 |
| 2017/0069667 A1* | 3/2017 | Chen | H01L 27/1443 |

* cited by examiner

US 9,748,285 B2

MANUFACTURE METHOD OF DUAL GATE OXIDE SEMICONDUCTOR TFT SUBSTRATE AND STRUCTURE THEREOF

FIELD OF THE INVENTION

The present invention relates to a display technology field, and more particularly to a manufacture method of a dual gate oxide semiconductor TFT substrate and a structure thereof applicable for the OLED.

BACKGROUND OF THE INVENTION

The flat panel display devices possess many merits of thin frame, power saving, no radiation, etc. and have been widely used. The present flat panel display devices at present mainly comprise the Liquid Crystal Display (LCD) and the Organic Light Emitting Display (OLED).

At present, in the active array flat panel display device, the TFT substrate generally utilizes the single-gate oxide semiconductor thin film transistor (Single-Gate TFT). The dual gate oxide semiconductor thin film transistor (Dual-Gate) possesses better performance than the single gate oxide semiconductor thin film transistor, For example, the electron mobility is higher, and the current of activation state is larger, and the subthreshold swing is smaller, and the stability and the uniformity of the threshold voltage are better, and the gate voltage bias and the light stability are better. In the OLED display device, the importance of the threshold voltage is significant. The stable, uniform threshold voltage can make the display brightness of the OLED be more even and the display quality be higher.

In the manufacture process of the OLED, for reducing the difficulty of the manufacture and preventing the deterioration and unevenness of the chromaticity and brightness of the organic light emitting material, the display method of white organic light emitting diode in cooperation with the Color Filter (CF) is commonly utilized. The manufactured of the color filter in the white light OLED display device is mainly accomplished in the array manufacture process of the TFT substrate. Namely, the Color Filter On Array (COA) technology is utilized.

A manufacture method of a dual gate oxide semiconductor TFT substrate applicable for the OLED mainly comprises steps of:

step 1, as shown in FIG. 1, providing a substrate 100, and deposing a first metal layer on the substrate 100, and implementing pattern process to the first metal layer with a first photo process to form a first bottom gate 210 and a second bottom gate 220; and deposing a bottom gate isolation layer 310 on the first bottom gate 210, the second bottom gate 220 and the substrate 100;

step 2, as shown in FIG. 2, implementing pattern processes to the bottom gate isolation layer 310 with a second photo process to expose a portion of the first bottom gate 210;

step 3, as shown in FIG. 3, deposing an oxide semiconductor layer on the bottom gate isolation layer 310, and implementing patterning process to the oxide semiconductor layer with a third photo process to obtain a first oxide semiconductor layer 410 and a second oxide semiconductor layer 420 respectively above the first bottom gate 210, the second bottom gate 220;

step 4, as shown in FIG. 4, deposing an etching stopper layer on the first oxide semiconductor layer 410 and the second oxide semiconductor layer 420 and the bottom gate isolation layer 310, and implementing patterning process to the etching stopper layer with a fourth photo process to form an etching stopper layer 500;

step 5, as shown in FIG. 5, deposing a second metal layer on the etching stopper layer 500, and implementing patterning process to the second metal layer with a fifth photo process to form a first source 610, a first drain 620, a second source 630, a second drain 640; the second source 630 contacts with the first bottom gate 210;

step 6, as shown in FIG. 6, deposing a passivation layer on the first source 610, the first drain 620, the second source 630, the second drain 640 and the etching stopper layer 500, and implementing patterning process to the passivation layer with a sixth photo process to form a passivation layer 700, and forming a via hole 720 above the first source 610;

step 7, as shown in FIG. 7, deposing a third metal layer on the passivation layer 700, and implementing patterning process to the third metal layer with a seventh photo process to form a first top gate 810 and a second top gate 820;

step 8, as shown in FIG. 8, deposing a color resist layer on the first top gate 810, the second top gate 820 and the passivation layer 700, and implementing patterning processes to the color resist layer with eighth, ninth, tenth photo processes to form red/green/blue color resist layers 900;

step 9, as shown in FIG. 9, deposing a first flat layer on the red/green/blue color resist layers 900, and implementing patterning process to the first flat layer with an eleventh photo process to form the first flat layer 1000;

step 10, as shown in FIG. 10, deposing an ITO layer on the first flat layer 1000, and implementing patterning process to the ITO layer to form an anode 1100 with a twelfth photo process, and the anode 1100 contacts with the first source 610 through the via hole 720;

step 11, as shown in FIG. 11, deposing a second flat layer on the first flat layer 1000 and the anode 1100, and implementing patterning process to the second flat layer with a thirteenth photo process to form a second flat layer 1200.

The aforesaid manufacture process of the oxide semiconductor TFT substrate applicable for the OLED requires thirteen photo processes in total. The manufacture process is complicated and the production efficiency is lower and the manufacture cost is higher.

SUMMARY OF THE INVENTION

An objective of the present invention is to provide a manufacture method of a dual gate oxide semiconductor TFT substrate applicable for the OLED with a simple process, capable of reducing the number of the photo processes, raising the production efficiency and lowering the production cost.

Another objective of the present invention is to provide a structure of a dual gate oxide semiconductor TFT substrate applicable for the OLED with simple structure, capable of reducing the number of the photo processes, effectively simplifying the manufacture process, raising the production efficiency and lowering the production cost.

For realizing the aforesaid objectives, the present invention provides a manufacture method of a dual gate oxide semiconductor TFT substrate, comprising steps of:

step 1, providing a substrate, and deposing a first metal layer on the substrate, and implementing pattern process to the first metal layer with a first photo process to form a first bottom gate and a second bottom gate; and deposing a bottom gate isolation layer on the first bottom gate, the second bottom gate and the substrate;

step 2, deposing a color resist layer on the bottom gate isolation layer, and sequentially implementing pattern processes to the color resist layer with second, third and fourth photo processes respectively to form red/green/blue color resist layers; then, deposing a first flat layer on the red/green/blue color resist layers, and implementing pattern process to the first flat layer with a fifth photo process to form first flat layers respectively covering the red/green/blue color resist layers; implementing plasma treatment to the bottom gate isolation layer;

step 3, deposing an oxide semiconductor layer on the bottom gate isolation layer and the first flat layers, and coating a photoresist layer on the oxide semiconductor layer, and employing a halftone mask to implement a sixth photo process: first, implementing exposure, development to the photoresist layer to obtain a first photoresist layer, a second photoresist layer, a third photoresist layer covering the oxide semiconductor layer respectively above the first bottom gate, the second bottom gate and the first flat layers; a thickness of two side areas of the first photoresist layer, a thickness of two side areas of the second photoresist layer and a thickness of the third photoresist layer are smaller than a thickness of a middle area of the first photoresist layer and a thickness of a middle area of the second photoresist layer;

employing the first photoresist layer, the second photoresist layer, and the third photoresist layer to implement etching the oxide semiconductor layer for patterning the oxide semiconductor layer to respectively obtain a first oxide semiconductor layer, a second oxide semiconductor layer and a third oxide semiconductor layer respectively above the first bottom gate, the second bottom gate and the first flat layers;

step 4, first, removing the two side areas of the first photoresist layer, the two side areas of the second photoresist layer and the third photoresist layer; employing the remaining middle area of the first photoresist layer and the remaining middle area of the second photoresist layer as being a mask layer to implement ion doping to the two side areas of the first oxide semiconductor layer, the two side areas of the second oxide semiconductor layer and the third oxide semiconductor layer, to transform the two side areas of the first oxide semiconductor layer and the two side areas of the second oxide semiconductor layer to be a conductor, and to transform the third oxide semiconductor layer to be an oxide conductor layer; then, removing the remaining middle area of the first photoresist layer and the remaining middle area of the second photoresist layer;

step 5, deposing a top gate isolation layer on the first oxide semiconductor layer, the second oxide semiconductor layer, the oxide conductor layer and the bottom gate isolation layer, and implementing pattern process to the top gate isolation layer and the bottom gate isolation layer at the same time with a seventh photo process, to respectively form first via holes above the two side areas of the first oxide semiconductor layer, second via holes above the two side areas of the second oxide semiconductor layer, a third via hole above the oxide conductor layer and a fourth via hole between the first bottom gate and the second bottom gate to expose one side of the second bottom gate;

step 6, deposing second, third metal layers on the top gate isolation layer, and implementing pattern process to the second, third metal layers with an eighth photo process, to respectively obtain a first top gate above the first oxide semiconductor layer, a first source and a first drain at two sides of the first top gate, a second top gate above the second oxide semiconductor layer and a second source and a second drain at two sides of the second top gate;

the first source and the first drain respectively contact with the two side areas of the first oxide semiconductor layer through the first via holes, and the second source and the second drain respectively contact with the two side areas of the second oxide semiconductor layer through the second via holes, and the first source contacts with the oxide conductor layer through the third via hole and the second source contacts with the first bottom gate through the fourth via hole;

step 7, deposing a passivation layer on the first top gate, the first source, the first drain, the second top gate, the second source, the second drain and the top gate isolation layer;

step 8, deposing a second flat layer on the passivation layer, and implementing patterning process to the second flat layer, the passivation layer and the top gate isolation layer at the same time with a ninth photo process to obtain a fifth via hole above the oxide conductor layer to expose a portion of the oxide conductor layer to define a shape of a light emitting layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

The step 3 utilizes physical vapor deposition for deposing the oxide semiconductor layer.

The step 5 utilizes dry etching for implementing pattern process to the top gate isolation layer and the bottom gate isolation layer at the same time.

Material of the oxide semiconductor layer is IGZO.

Material of the first flat layer and the second flat layer is organic photoresist.

Material of the first bottom gate, the first top gate, the first source, the first drain, the second bottom gate, the second top gate, the second source and the second drain is a stack combination of one or more of molybdenum, titanium, aluminum and copper.

Material of the bottom gate isolation layer and the top gate isolation layer is Silicon Nitride, Silicon Oxide, or a combination of the two.

The present invention further provides a structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, red/green/blue color resist layers positioned on the bottom gate isolation layer, first flat layers correspondingly covering the red/green/blue color resist layers, a first oxide semiconductor layer and a second oxide semiconductor layer positioned on the bottom gate isolation layer respectively above the first bottom gate and the second bottom gate, an oxide conductor layer positioned on the first flat layers, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a second flat layer positioned on the passivation layer;

two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the second flat layer are provided with a fifth via hole correspondingly above the oxide conductor layer;

the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

Material of the first oxide semiconductor layer and the second oxide semiconductor layer is IGZO, and the oxide conductor layer is manufactured by implementing ion doping to the IGZO semiconductor layer.

Material of the first flat layer and the second flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

The present invention further provides a structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, red/green/blue color resist layers positioned on the bottom gate isolation layer, first flat layers correspondingly covering the red/green/blue color resist layers, a first oxide semiconductor layer and a second oxide semiconductor layer positioned on the bottom gate isolation layer respectively above the first bottom gate and the second bottom gate, an oxide conductor layer positioned on the first flat layers, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a second flat layer positioned on the passivation layer;

two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the second flat layer are provided with a fifth via hole correspondingly above the oxide conductor layer;

the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED;

wherein material of the first oxide semiconductor layer and the second oxide semiconductor layer is IGZO, and the oxide conductor layer is manufactured by implementing ion doping to the IGZO semiconductor layer;

wherein material of the first flat layer and the second flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

The benefits of the present invention are: the manufacture method of the dual gate oxide semiconductor TFT substrate provided by the present invention utilizes the halftone mask to implement one photo process, which cannot only accomplish the patterning to the oxide semiconductor layer but also obtain the oxide conductor layer with ion doping process, and the oxide conductor layer is employed as being the anode of the OLED to replace the ITO anode in prior art; the method implements the patterning process to the bottom gate isolation layer and the top gate isolation layer at the same time with one photo process; the method implements pattern process to the second, third metal layers with one photo process; the method manufactures the first top gate, the first source, the first drain, the second top gate, the second source, the second drain at the same time with one photo process to obtain the first source, the first drain, the second source, the second drain, the first top gate and the second top gate; the method implements patterning process to the second flat layer, the passivation layer and the top gate isolation layer at the same time with one photo process, to reduce the number of the photo processes to nine for effectively simplifying the manufacture process, raising the production efficiency and lowering the production cost. The structure of the dual gate oxide semiconductor TFT substrate provided by the present invention positions the oxide conductor layer to be the anode of the OLED, and the method positions all of the first source, the first drain, the second source, the second drain, the first top gate and the second top gate on the top gate isolation layer to make the structure of the TFT substrate simple and easy for manufacture, and is capable of reducing the number of the photo processes, effectively simplifying the manufacture process, raising the production efficiency and lowering the production cost.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 12:
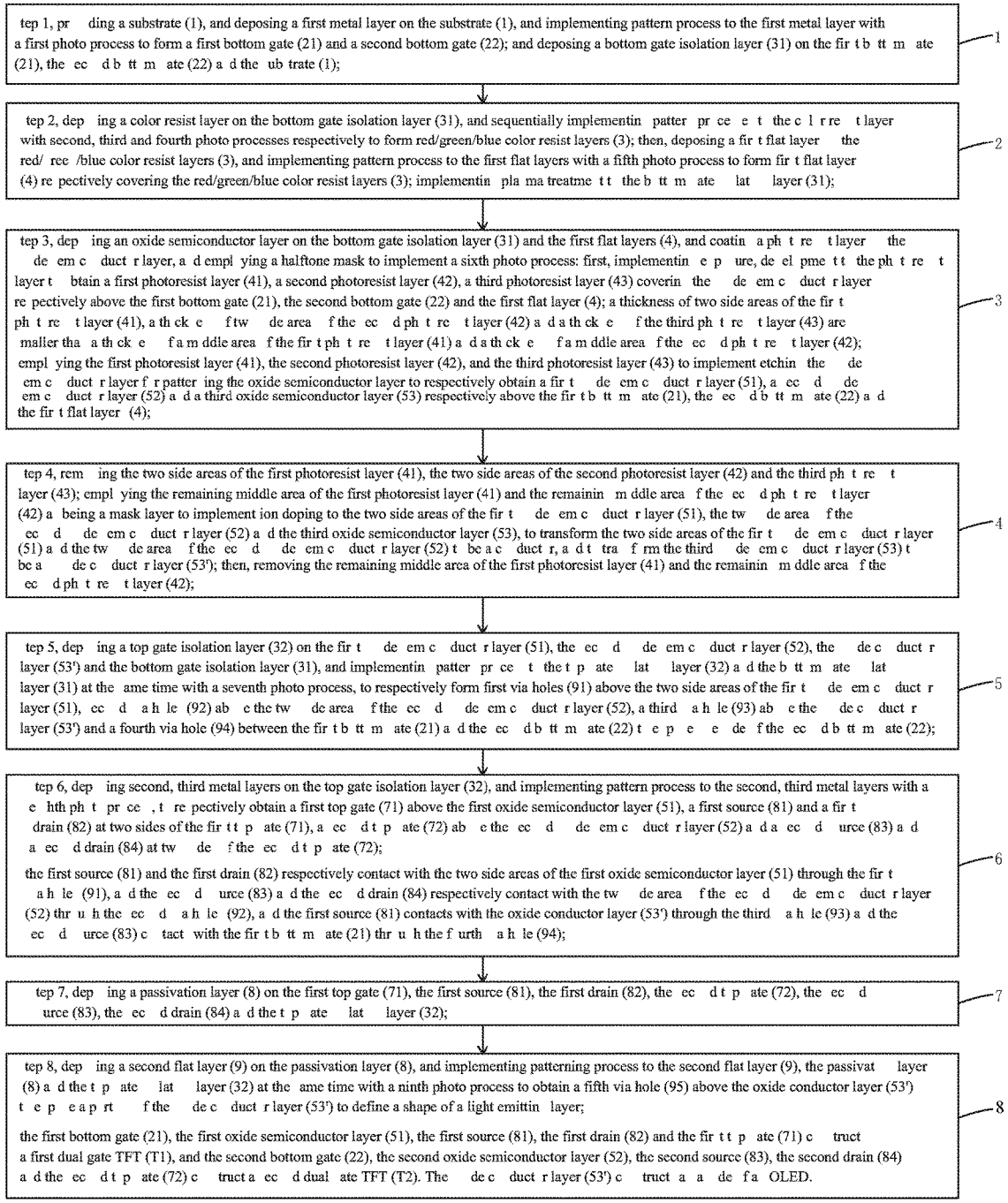
FIG. 12 is a flowchart of a manufacture method of a dual gate oxide semiconductor TFT substrate according to the present invention.
Figure 13:
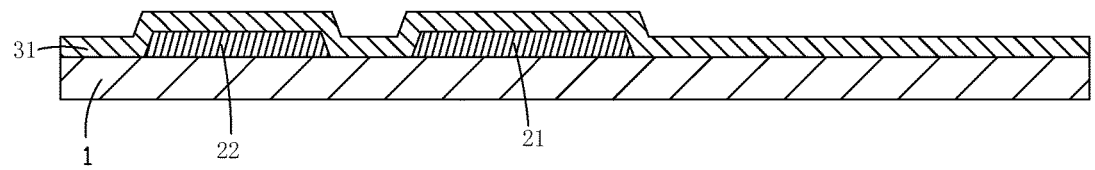
FIG. 13 is a diagram of step 1 of the manufacture method of the dual gate oxide semiconductor TFT substrate according to the present invention.

Please refer to FIG. 12. The present invention first provides a manufacture method of a dual gate oxide semiconductor TFT substrate applicable for the OLED, comprising steps of:

step 1, as shown in FIG. 13, providing a substrate 1, and deposing a first metal layer on the substrate 1, and implementing pattern process to the first metal layer with a first photo process to form a first bottom gate 21 and a second bottom gate 22; and deposing a bottom gate isolation layer 31 on the first bottom gate 21, the second bottom gate 22 and the substrate 1.

Specifically, the substrate 1 is a transparent substrate. Preferably, the substrate 1 is a glass substrate. Material of the first metal layer is a stack combination of one or more of one or more of molybdenum (Mo), titanium (Ti), aluminum (Al) and copper (Cu). That is to say, material of the first bottom gate 21 and the second bottom gate 22 is a stack combination of one or more of molybdenum, titanium, aluminum and copper. Material of the bottom gate isolation layer 31 is Silicon Nitride (SiNx), Silicon Oxide (SiOx), or a combination of the two.

Figure 14:
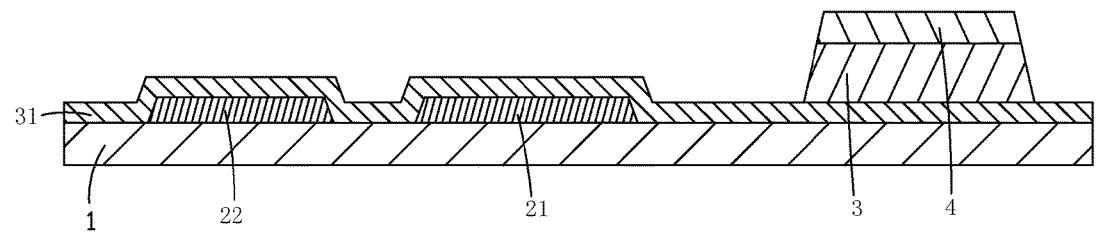
FIG. 14 is a diagram of step 2 of the manufacture method of the dual gate oxide semiconductor TFT substrate according to the present invention.

Step 2, as shown in FIG. 14, deposing a color resist layer on the bottom gate isolation layer 31, and sequentially implementing pattern processes to the color resist layer with second, third and fourth photo processes respectively to form red/green/blue color resist layers 3; then, deposing a first flat layer on the red/green/blue color resist layers 3, and implementing pattern process to the first flat layers with a fifth photo process to form first flat layers 4 respectively covering the red/green/blue color resist layers 3; implementing plasma treatment to the bottom gate isolation layer 31. Specifically, material of the first flat layer 4 is organic photoresist employed for covering and protecting the red/ green/blue color resist layers 3. The plasma treatment implemented to the bottom gate isolation layer 31 can improve the film quality of the bottom gate isolation layer 31.

Figure 15:
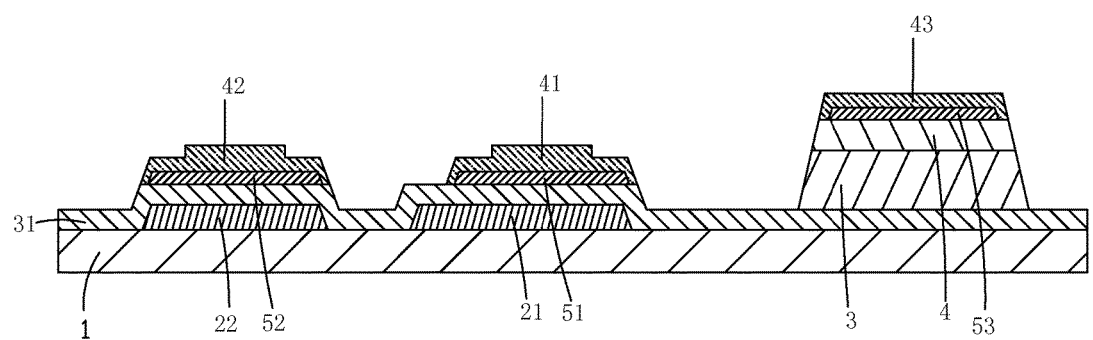
FIG. 15 is a diagram of step 3 of the manufacture method of the dual gate oxide semiconductor TFT substrate according to the present invention.

Step 3, as shown in FIG. 15, depositing an oxide semiconductor layer on the bottom gate isolation layer 31 and the first flat layers 4, and coating a photoresist layer on the oxide semiconductor layer, and employing a halftone mask to implement a sixth photo process: first, implementing exposure, development to the photoresist layer to obtain a first photoresist layer 41, a second photoresist layer 42, a third photoresist layer 43 covering the oxide semiconductor layer respectively above the first bottom gate 21, the second bottom gate 22 and the first flat layer 4; a thickness of two side areas of the first photoresist layer 41, a thickness of two side areas of the second photoresist layer 42 and a thickness of the third photoresist layer 43 are smaller than a thickness of a middle area of the first photoresist layer 41 and a thickness of a middle area of the second photoresist layer 42.

employing the first photoresist layer 41, the second photoresist layer 42, and the third photoresist layer 43 to implement etching the oxide semiconductor layer for patterning the oxide semiconductor layer to respectively obtain a first oxide semiconductor layer 51, a second oxide semiconductor layer 52 and a third oxide semiconductor layer 53 respectively above the first bottom gate 21, the second bottom gate 22 and the first flat layers 4.

Specifically, physical vapor deposition (PVD) is utilized for deposing the oxide semiconductor layer.

Material of the oxide semiconductor layer is Indium Gallium Zinc Oxide (IGZO).

Figure 16:
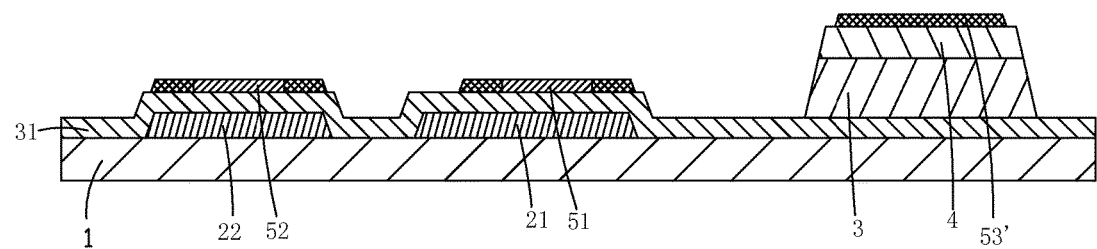
FIG. 16 is a diagram of step 4 of the manufacture method of the dual gate oxide semiconductor TFT substrate according to the present invention.

Step 4, as shown in FIG. 16, removing the two side areas of the first photoresist layer 51, the two side areas of the second photoresist layer 52 and the third photoresist layer 53; employing the remaining middle area of the first photoresist layer 51 and the remaining middle area of the second photoresist layer 52 as being a mask layer to implement ion doping to the two side areas of the first oxide semiconductor layer 51, the two side areas of the second oxide semiconductor layer 52 and the third oxide semiconductor layer 53, to transform the two side areas of the first oxide semiconductor layer 51 and the two side areas of the second oxide semiconductor layer 52 to be a conductor, and to transform the third oxide semiconductor layer 53 to be an oxide conductor layer 53'; then, removing the remaining middle area of the first photoresist layer 51 and the remaining middle area of the second photoresist layer 52.

Figure 17:
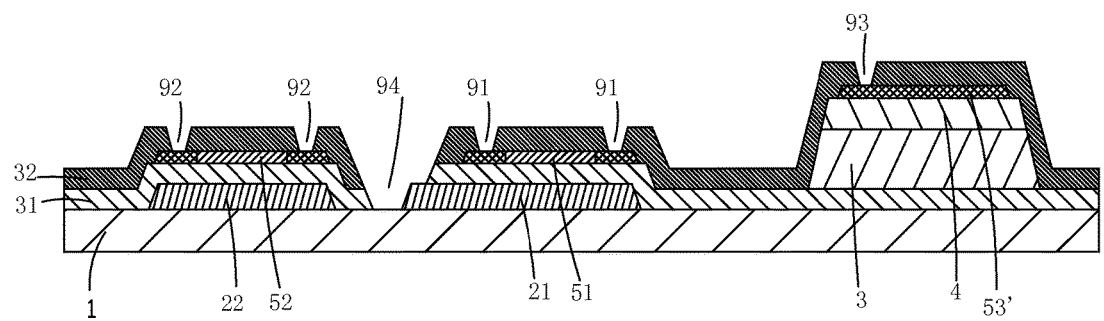
FIG. 17 is a diagram of step 5 of the manufacture method of the dual gate oxide semiconductor TFT substrate according to the present invention.
Figure 18:
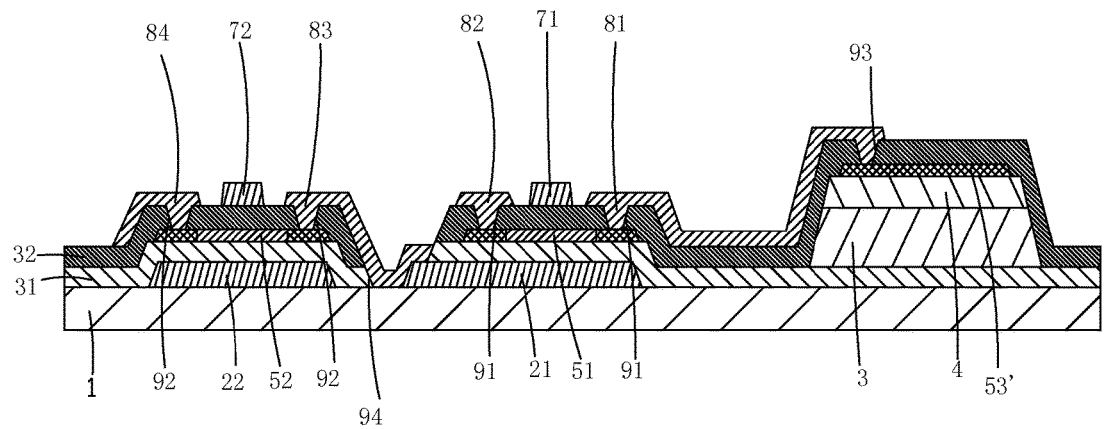
FIG. 18 is a diagram of step 6 of the manufacture method of the dual gate oxide semiconductor TFT substrate according to the present invention.

Step 5, as shown in FIG. 17, deposing a top gate isolation layer 32 on the first oxide semiconductor layer 51, the second oxide semiconductor layer 52, the oxide conductor layer 53' and the bottom gate isolation layer 31, and implementing pattern process to the top gate isolation layer 32 and the bottom gate isolation layer 31 at the same time with a seventh photo process, to respectively form first via holes 91 above the two side areas of the first oxide semiconductor layer 51, second via holes 92 above the two side areas of the second oxide semiconductor layer 52, a third via hole 93 above the oxide conductor layer 53' and a fourth via hole 94 between the first bottom gate 21 and the second bottom gate 22 to expose one side of the second bottom gate 22.

Specifically, material of the top gate isolation layer 32 is Silicon Nitride, Silicon Oxide, or a combination of the two.

Specifically, dry etching is employed for implementing pattern process to the top gate isolation layer 32 and the bottom gate isolation layer 31 at the same time.

Figure 1:
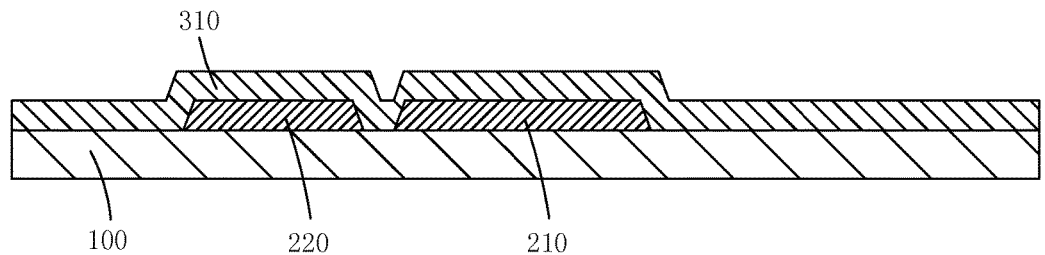
FIG. 1 is a diagram of step 1 of a manufacture method of a dual gate oxide semiconductor TFT substrate applicable for OLED according to prior art.
Figure 2:
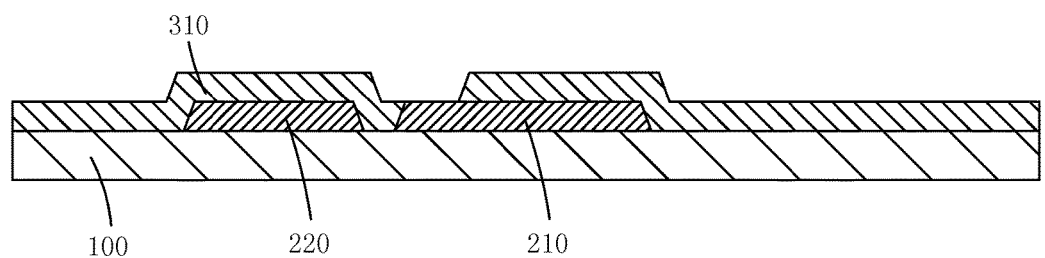
FIG. 2 is a diagram of step 2 of the manufacture method of the dual gate oxide semiconductor TFT substrate applicable for OLED according to prior art.
Figure 3:
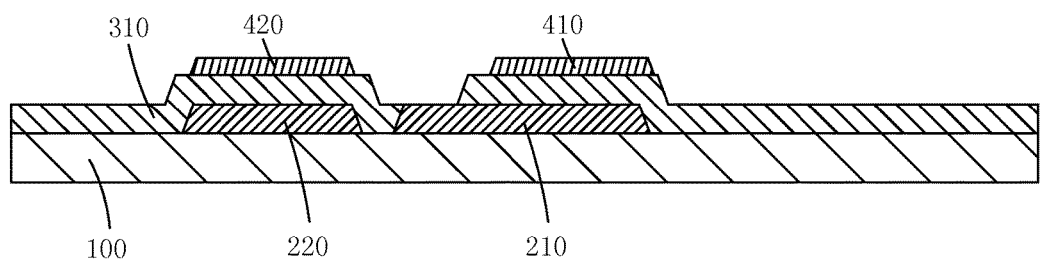
FIG. 3 is a diagram of step 3 of the manufacture method of the dual gate oxide semiconductor TFT substrate applicable for OLED according to prior art.
Figure 4:
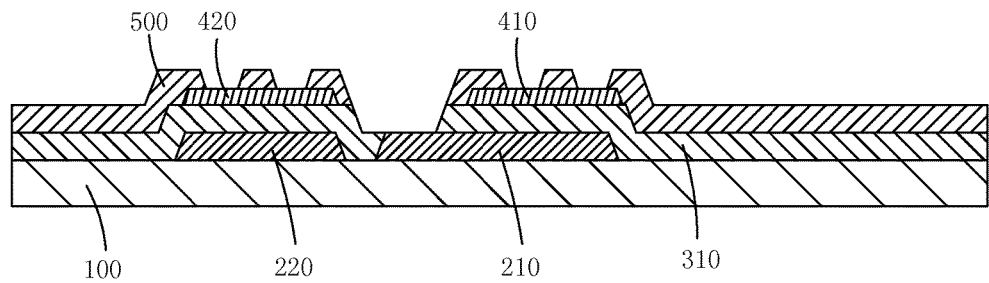
FIG. 4 is a diagram of step 4 of the manufacture method of the dual gate oxide semiconductor TFT substrate applicable for OLED according to prior art.
Figure 5:
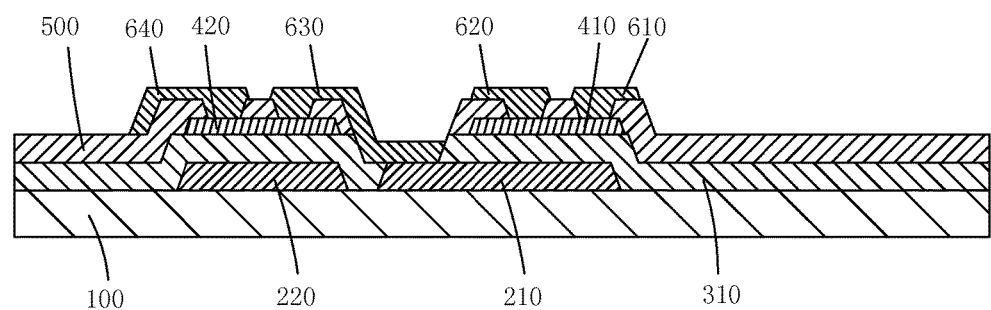
FIG. 5 is a diagram of step 5 of the manufacture method of the dual gate oxide semiconductor TFT substrate applicable for OLED according to prior art.
Figure 6:
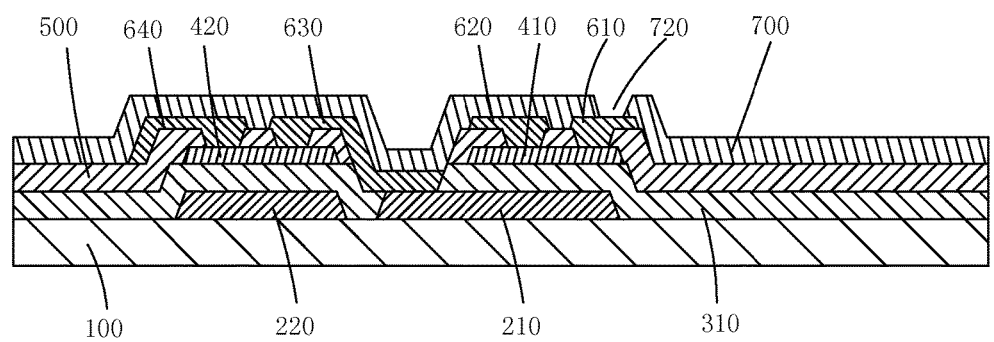
FIG. 6 is a diagram of step 6 of the manufacture method of the dual gate oxide semiconductor TFT substrate applicable for OLED according to prior art.
Figure 7:
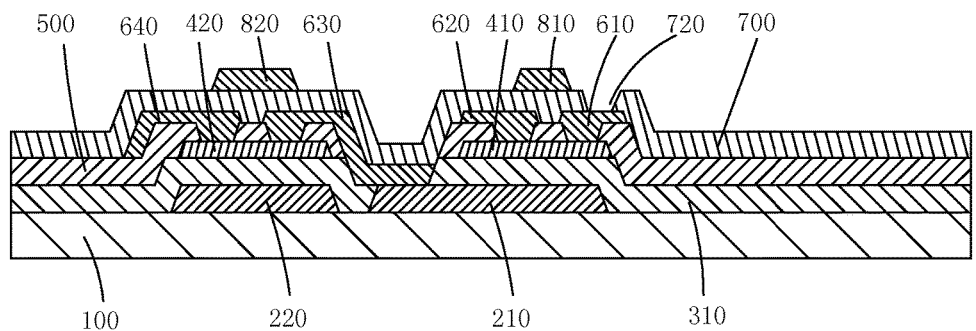
FIG. 7 is a diagram of step 7 of the manufacture method of the dual gate oxide semiconductor TFT substrate applicable for OLED according to prior art.
Figure 8:
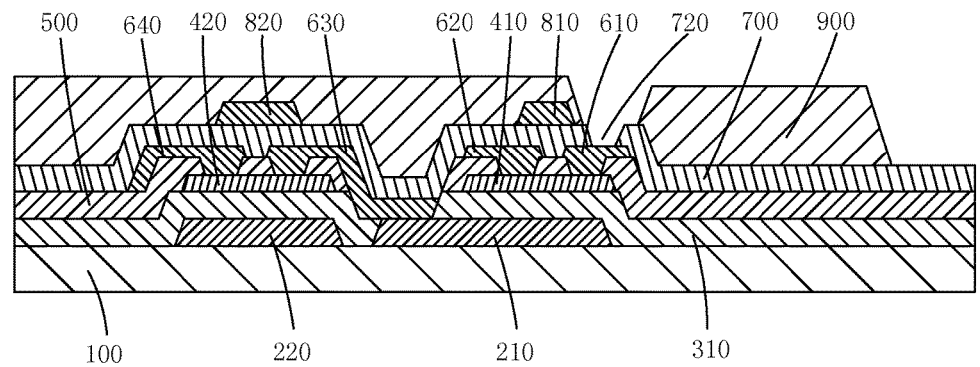
FIG. 8 is a diagram of step 8 of the manufacture method of the dual gate oxide semiconductor TFT substrate applicable for OLED according to prior art.
Figure 9:
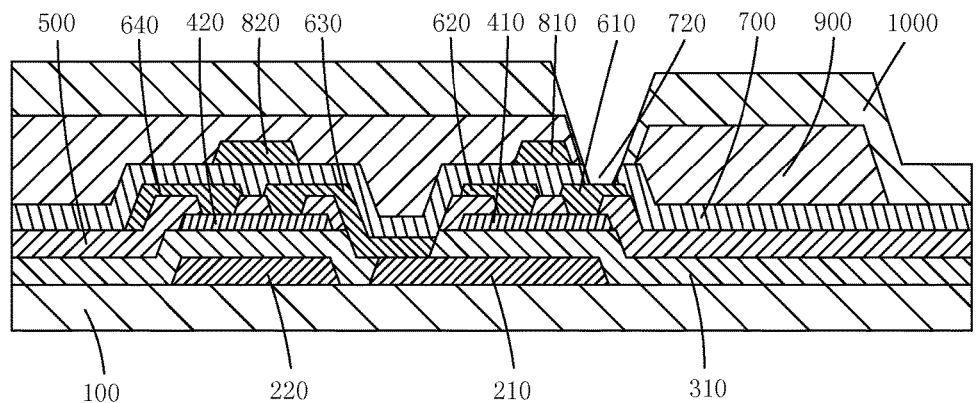
FIG. 9 is a diagram of step 9 of the manufacture method of the dual gate oxide semiconductor TFT substrate applicable for OLED according to prior art.
Figure 10:
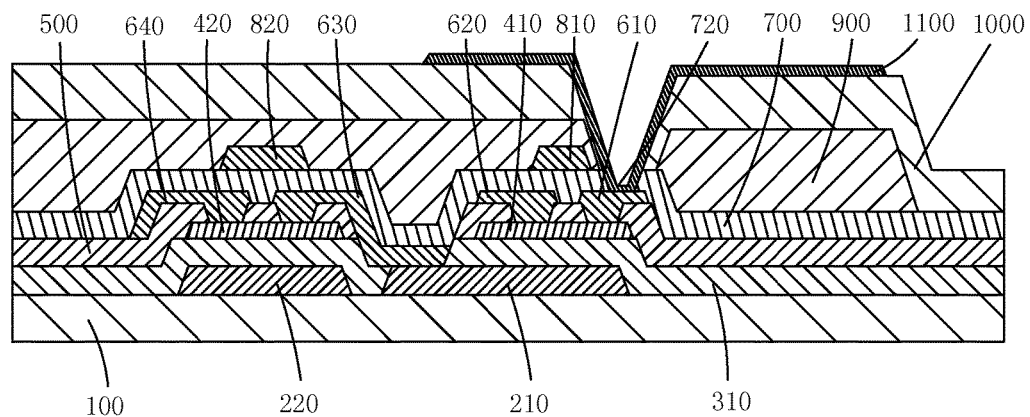
FIG. 10 is a diagram of step 10 of the manufacture method of the dual gate oxide semiconductor TFT substrate applicable for OLED according to prior art.
Figure 11:
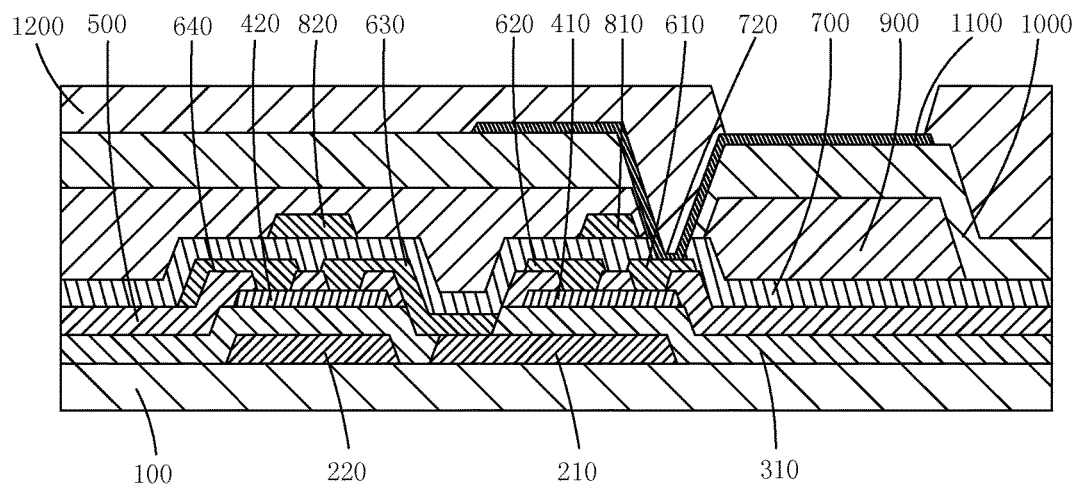
FIG. 11 is a diagram of step 11 of the manufacture method of the dual gate oxide semiconductor TFT substrate applicable for OLED according to prior art.

Step 6, as shown in FIG. 8, deposing second, third metal layers on the top gate isolation layer 32, and implementing pattern process to the second, third metal layers with an eighth photo process, to respectively obtain a first top gate 71 above the first oxide semiconductor layer 51, a first source 81 and a first drain 82 at two sides of the first top gate 71, a second top gate 72 above the second oxide semiconductor layer 52 and a second source 83 and a second drain 84 at two sides of the second top gate 72.

The first source 81 and the first drain 82 respectively contact with the two side areas of the first oxide semiconductor layer 51 through the first via holes 91, and the second source 83 and the second drain 84 respectively contact with the two side areas of the second oxide semiconductor layer 52 through the second via holes 92, and the first source 81 contacts with the oxide conductor layer 53' through the third via hole 93 and the second source 83 contacts with the first bottom gate 21 through the fourth via hole 94.

Specifically, material of the second, third metal layers is a stack combination of one or more of one or more of molybdenum, titanium, aluminum and copper. That is to say, material of the first top gate 71, the first source 81, the first drain 82, the second top gate 72, the second source 83 and the second drain 84 is a stack combination of one or more of molybdenum, titanium, aluminum and copper.

Figure 19:
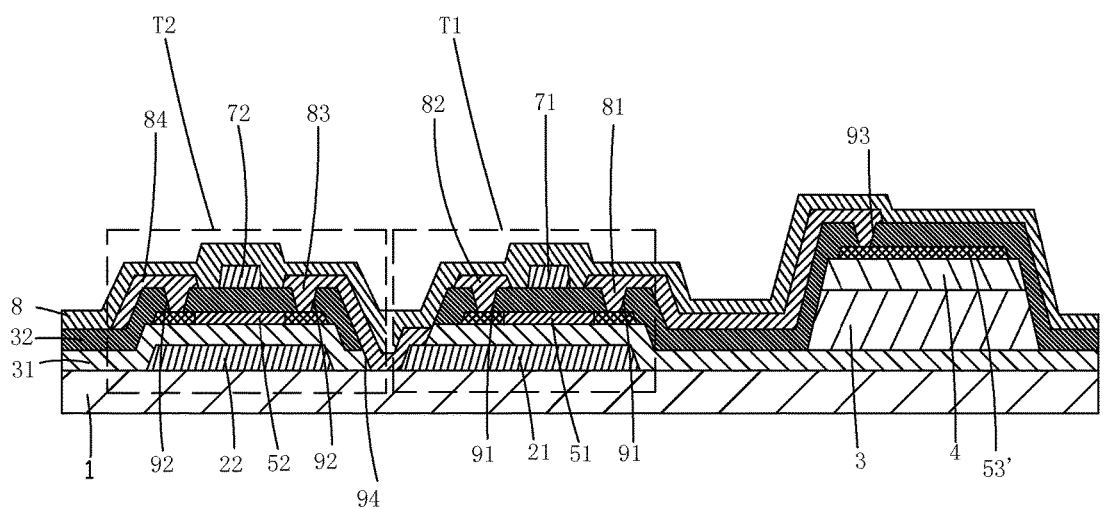
FIG. 19 is a diagram of step 7 of the manufacture method of the dual gate oxide semiconductor TFT substrate according to the present invention.

Step 7, as shown in FIG. 19, deposing a passivation layer 8 on the first top gate 71, the first source 81, the first drain 82, the second top gate 72, the second source 83, the second drain 84 and the top gate isolation layer 32.

Figure 20:
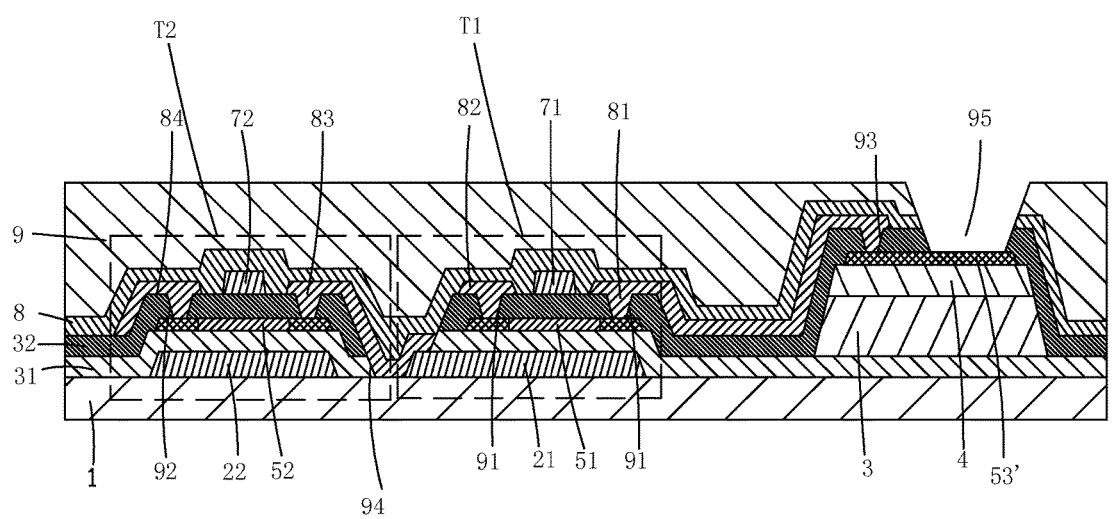
FIG. 20 is a diagram of step 8 of the manufacture method of the dual gate oxide semiconductor TFT substrate according to the present invention and a sectional diagram of a structure of a dual gate oxide semiconductor TFT substrate according to the present invention.

Step 8, as shown in FIG. 20, deposing a second flat layer 9 on the passivation layer 8, and implementing patterning process to the second flat layer 9, the passivation layer 8 and the top gate isolation layer 32 at the same time with a ninth photo process to obtain a fifth via hole 95 above the oxide conductor layer 53' to expose a portion of the oxide conductor layer 53' to define a shape of a light emitting layer.

The first bottom gate 21, the first oxide semiconductor layer 51, the first source 81, the first drain 82 and the first top gate 71 construct a first dual gate TFT T1, and the second bottom gate 22, the second oxide semiconductor layer 52, the second source 83, the second drain 84 and the second top gate 72 construct a second dual gate TFT T2. The oxide conductor layer 53' constructs an anode of an OLED.

Specifically, material of the second flat layer 9 is organic material.

The aforesaid manufacture method of the dual gate oxide semiconductor TFT substrate utilizes the halftone mask to implement one photo process, which cannot only accomplish the patterning to the oxide semiconductor layer but also obtain the oxide conductor layer 53' with ion doping process; the method implements the patterning process to the bottom gate isolation layer 31 and the top gate isolation layer 32 at the same time with one photo process; the method implements patterning process to the second, third metal layers at the same time to obtain the first source 81, the first drain 82, the second source 83, the second drain 84, the first top gate 71 and the second top gate 72 with one photo process; the method implements patterning process to the second flat layer 9, the passivation layer 8 and the top gate isolation layer 32 at the same time with one photo process, to reduce the number of the photo processes to nine for effectively simplifying the manufacture process, raising the production efficiency and lowering the production cost.

Please refer to FIG. 20. The present invention further provides a structure of a dual gate oxide semiconductor TFT substrate applicable for the OLED, comprising a substrate 1, a first bottom gate 21 and a second bottom gate 22 positioned on the substrate 1, a bottom gate isolation layer 31 positioned on the substrate 1 and the first bottom gate 21 and the second bottom gate 22, red/green/blue color resist layers 3 positioned on the bottom gate isolation layer 31, first flat layers 4 correspondingly covering the red/green/blue color resist layers 3, a first oxide semiconductor layer 51 and a second oxide semiconductor layer 52 positioned on the bottom gate isolation layer 31 respectively above the first bottom gate 21 and the second bottom gate 22, an oxide conductor layer 53' positioned on the first flat layers 4, a top gate isolation layer 32 positioned on the first oxide semiconductor layer 51, the second oxide semiconductor layer 52, the oxide conductor layer 53' and the bottom gate isolation layer 31, a first top gate 71 positioned on the top gate isolation layer 32 above the first oxide semiconductor layer 51, a first source 81 and a first drain 82 positioned on the top gate isolation layer 32 respectively at two sides of the first top gate 71, a second top gate 72 positioned on the top gate isolation layer 32 above the second oxide semiconductor layer 52, a second source 83 and a second drain 84 positioned on the top gate isolation layer 32 respectively at two sides of the second top gate 72, a passivation layer 8 positioned on the first top gate 71, the first source 81, the first drain 82, the second top gate 72, the second source 83, the second drain 84 and the top gate isolation layer 32, and a second flat layer 9 positioned on the passivation layer 8.

Two areas of the first oxide semiconductor layer 51 and two areas of the second oxide semiconductor layer 52 are ion doping conductor layers; the top gate isolation layer 32 is provided with first via holes 91 correspondingly above the two side areas of the first oxide semiconductor layer 51, and is provided with second via holes 92 correspondingly above the two side areas of the second oxide semiconductor layer 52, and is provided with a third via hole 93 correspondingly above the oxide conductor layer 53', and the bottom gate isolation layer 31 and the top gate isolation layer 32 are provided with a fourth via hole 94 correspondingly between the first bottom gate 21 and the second bottom gate 22; the top gate isolation layer 32, the passivation layer 8 and the second flat layer 9 are provided with a fifth via hole 95 correspondingly above the oxide conductor layer 53'; the first source 81 and the first drain 82 respectively contact with the two side areas of the first oxide semiconductor layer 51 through the first via holes 91; the second source 83 and the second drain 84 respectively contact with the two side areas of the second oxide semiconductor layer 52 through the second via holes 92; the first source contacts 81 with the oxide conductor layer 53' through the third via hole 93; the second source 83 contacts with the first bottom gate 21 through the fourth via hole 94; the fifth via hole 95 exposes a portion of the oxide conductor layer 53'.

The first bottom gate 21, the first oxide semiconductor layer 51, the first source 81, the first drain 82 and the first top gate 71 construct a first dual gate TFT T1, and the second bottom gate 22, the second oxide semiconductor layer 52, the second source 83, the second drain 84 and the second top gate 72 construct a second dual gate TFT T2. The oxide conductor layer 53' constructs an anode of an OLED.

Material of the first oxide semiconductor layer 51 and the second oxide semiconductor layer 52 is IGZO, and the oxide conductor layer 53' is manufactured by implementing ion doping to the IGZO semiconductor layer. Material of the first flat layer 4 and the second flat layer 9 is organic photoresist; material of the bottom gate isolation layer 31 and the top gate isolation layer 32 is Silicon Nitride, Silicon Oxide, or a combination of the two; material of the first bottom gate 21, the first top gate 71, the first source 81, the first drain 82, the second bottom gate 22, the second top gate 72, the second source 83 and the second drain 84 is a stack combination of one or more of molybdenum, titanium, aluminum and copper.

The aforesaid structure of the dual gate oxide semiconductor TFT substrate positions the oxide conductor layer 53' to be the anode of the OLED, and positions all of the first source 81, the first drain 82, the second source 83, the second drain 84, the first top gate 71 and the second top gate 72 on the top gate isolation layer 32 to make the structure of the TFT substrate simple and easy for manufacture, and is capable of reducing the number of the photo processes, effectively simplifying the manufacture process, raising the production efficiency and lowering the production cost.

In conclusion, the manufacture method of the dual gate oxide semiconductor TFT substrate according to the present invention utilizes the halftone mask to implement one photo process, which cannot only accomplish the patterning to the oxide semiconductor layer but also obtain the oxide conductor layer with ion doping process, and the oxide conductor layer is employed as being the anode of the OLED to replace the ITO anode in prior art; the method implements the patterning process to the bottom gate isolation layer and the top gate isolation layer at the same time with one photo process; the method implements pattern process to the second, third metal layers with one photo process; the method manufactures the first top gate, the first source, the first drain, the second top gate, the second source, the second drain at the same time with one photo process to obtain the first source, the first drain, the second source, the second drain, the first top gate and the second top gate; the method implements patterning process to the second flat layer, the passivation layer and the top gate isolation layer at the same time with one photo process, to reduce the number of the photo processes to nine for effectively simplifying the manufacture process, raising the production efficiency and lowering the production cost. The structure of the dual gate oxide semiconductor TFT substrate according to the present invention positions the oxide conductor layer to be the anode of the OLED, and the method positions all of the first source, the first drain, the second source, the second drain, the first top gate and the second top gate on the top gate isolation layer to make the structure of the TFT substrate simple and easy for manufacture, and is capable of reducing the number of the photo processes, effectively simplifying the manufacture process, raising the production efficiency and lowering the production cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a dual gate oxide semiconductor TFT substrate, comprising steps of:

step 1, providing a substrate, and deposing a first metal layer on the substrate, and implementing pattern process to the first metal layer with a first photo process to form a first bottom gate and a second bottom gate; and deposing a bottom gate isolation layer on the first bottom gate, the second bottom gate and the substrate;

step 2, deposing a color resist layer on the bottom gate isolation layer, and sequentially implementing pattern processes to the color resist layer with second, third and fourth photo processes respectively to form red/green/blue color resist layers; then, deposing a first flat layer on the red/green/blue color resist layers, and implementing pattern process to the first flat layer with a fifth photo process to form first flat layers respectively covering the red/green/blue color resist layers; implementing plasma treatment to the bottom gate isolation layer;

step 3, depositing an oxide semiconductor layer on the bottom gate isolation layer and the first flat layers, and coating a photoresist layer on the oxide semiconductor layer, and employing a halftone mask to implement a sixth photo process: first, implementing exposure, development to the photoresist layer to obtain a first photoresist layer, a second photoresist layer, a third photoresist layer covering the oxide semiconductor layer respectively above the first bottom gate, the second bottom gate and the first flat layers; a thickness of two side areas of the first photoresist layer, a thickness of two side areas of the second photoresist layer and a thickness of the third photoresist layer are smaller than a thickness of a middle area of the first photoresist layer and a thickness of a middle area of the second photoresist layer;

employing the first photoresist layer, the second photoresist layer, and the third photoresist layer to implement etching the oxide semiconductor layer for patterning the oxide semiconductor layer to respectively obtain a first oxide semiconductor layer, a second oxide semiconductor layer and a third oxide semiconductor layer respectively above the first bottom gate, the second bottom gate and the first flat layers;

step 4, first, removing the two side areas of the first photoresist layer, the two side areas of the second photoresist layer and the third photoresist layer; employing the remaining middle area of the first photoresist layer and the remaining middle area of the second photoresist layer as being a mask layer to implement ion doping to the two side areas of the first oxide semiconductor layer, the two side areas of the second oxide semiconductor layer and the third oxide semiconductor layer, to transform the two side areas of the first oxide semiconductor layer and the two side areas of the second oxide semiconductor layer to be a conductor, and to transform the third oxide semiconductor layer to be an oxide conductor layer; then, removing the remaining middle area of the first photoresist layer and the remaining middle area of the second photoresist layer;

step 5, depositing a top gate isolation layer on the first oxide semiconductor layer, the second oxide semiconductor layer, the oxide conductor layer and the bottom gate isolation layer, and implementing pattern process to the top gate isolation layer and the bottom gate isolation layer at the same time with a seventh photo process, to respectively form first via holes above the two side areas of the first oxide semiconductor layer, second via holes above the two side areas of the second oxide semiconductor layer, a third via hole above the oxide conductor layer and a fourth via hole between the first bottom gate and the second bottom gate to expose one side of the first bottom gate;

step 6, depositing second, third metal layers on the top gate isolation layer, and implementing pattern process to the second, third metal layers with an eighth photo process, to respectively obtain a first top gate above the first oxide semiconductor layer, a first source and a first drain at two sides of the first top gate, a second top gate above the second oxide semiconductor layer and a second source and a second drain at two sides of the second top gate;

the first source and the first drain respectively contact with the two side areas of the first oxide semiconductor layer through the first via holes, and the second source and the second drain respectively contact with the two side areas of the second oxide semiconductor layer through the second via holes, and the first source contacts with the oxide conductor layer through the third via hole and the second source contacts with the first bottom gate through the fourth via hole;

step 7, depositing a passivation layer on the first top gate, the first source, the first drain, the second top gate, the second source, the second drain and the top gate isolation layer;

step 8, depositing a second flat layer on the passivation layer, and implementing patterning process to the second flat layer, the passivation layer and the top gate isolation layer at the same time with a ninth photo process to obtain a fifth via hole above the oxide conductor layer to expose a portion of the oxide conductor layer to define a shape of a light emitting layer;

the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

2. The manufacture method of the dual gate oxide semiconductor TFT substrate according to claim 1, wherein the step 3 utilizes physical vapor deposition for depositing the oxide semiconductor layer.

3. The manufacture method of the dual gate oxide semiconductor TFT substrate according to claim 1, wherein the step 5 utilizes dry etching for implementing pattern process to the top gate isolation layer and the bottom gate isolation layer at the same time.

4. The manufacture method of the oxide semiconductor TFT substrate according to claim 1, wherein material of the oxide semiconductor layer is IGZO.

5. The manufacture method of the dual gate oxide semiconductor TFT substrate according to claim 1, wherein material of the first flat layer and the second flat layer is organic photoresist.

6. The manufacture method of the dual gate oxide semiconductor TFT substrate according to claim 1, wherein material of the first bottom gate, the first top gate, the first source, the first drain, the second bottom gate, the second top gate, the second source and the second drain is a stack combination of one or more of molybdenum, titanium, aluminum and copper.

7. The manufacture method of the dual gate oxide semiconductor TFT substrate according to claim 1, wherein material of the bottom gate isolation layer and the top gate isolation layer is Silicon Nitride, Silicon Oxide, or a combination of the two.

8. A structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, red/green/blue color resist layers positioned on the bottom gate isolation layer, first flat layers correspondingly covering the red/green/blue color resist layers, a first oxide semiconductor layer and a second oxide semiconductor layer positioned on the bottom gate isolation layer respectively above the first bottom gate and the second bottom gate, an oxide conductor layer positioned on the first flat layers, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a second flat layer positioned on the passivation layer;
- two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the second flat layer are provided with a fifth via hole correspondingly above the oxide conductor layer;
- the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;
- the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED.

9. The structure of the dual gate oxide semiconductor TFT substrate according to claim 8, wherein material of the first oxide semiconductor layer and the second oxide semiconductor layer is IGZO, and the oxide conductor layer is manufactured by implementing ion doping to the IGZO semiconductor layer.

10. The structure of the dual gate oxide semiconductor TFT substrate according to claim 8, wherein material of the first flat layer and the second flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

11. A structure of a dual gate oxide semiconductor TFT substrate, comprising a substrate, a first bottom gate and a second bottom gate positioned on the substrate, a bottom gate isolation layer positioned on the substrate and the first bottom gate and the second bottom gate, red/green/blue color resist layers positioned on the bottom gate isolation layer, first flat layers correspondingly covering the red/green/blue color resist layers, a first oxide semiconductor layer and a second oxide semiconductor layer positioned on the bottom gate isolation layer respectively above the first bottom gate and the second bottom gate, an oxide conductor layer positioned on the first flat layers, a top gate isolation layer positioned on the first oxide semiconductor layer, the second oxide semiconductor layer, the oxide conductor layer and the bottom gate isolation layer, a first top gate positioned on the top gate isolation layer above the first oxide semiconductor layer, a first source and a first drain positioned on the top gate isolation layer respectively at two sides of the first top gate, a second top gate positioned on the top gate isolation layer above the second oxide semiconductor layer, a second source and a second drain positioned on the top gate isolation layer respectively at two sides of the second top gate, a passivation layer positioned on the first top gate, the first source, the first drain, the second top gate, the second source, the second drain and the top gate isolation layer, and a second flat layer positioned on the passivation layer;
- two areas of the first oxide semiconductor layer and two areas of the second oxide semiconductor layer are ion doping conductor layers; the top gate isolation layer is provided with first via holes correspondingly above the two side areas of the first oxide semiconductor layer, and the top gate isolation layer is provided with second via holes correspondingly above the two side areas of the second oxide semiconductor layer, and the top gate isolation layer is provided with a third via hole correspondingly above the oxide conductor layer; the bottom gate isolation layer and the top gate isolation layer are provided with a fourth via hole correspondingly between the first bottom gate and the second bottom gate; the top gate isolation layer, the passivation layer and the second flat layer are provided with a fifth via hole correspondingly above the oxide conductor layer;
- the first source and the first drain respectively contact with the two side areas of the first oxide semiconductor layer through the first via holes; the second source and the second drain respectively contact with the two side areas of the second oxide semiconductor layer through the second via holes; the first source contacts with the oxide conductor layer through the third via hole; the second source contacts with the first bottom gate through the fourth via hole; the fifth via hole exposes a portion of the oxide conductor layer;
- the first bottom gate, the first oxide semiconductor layer, the first source, the first drain and the first top gate construct a first dual gate TFT, and the second bottom gate, the second oxide semiconductor layer, the second source, the second drain and the second top gate construct a second dual gate TFT; the oxide conductor layer constructs an anode of an OLED;
- wherein material of the first oxide semiconductor layer and the second oxide semiconductor layer is IGZO, and the oxide conductor layer is manufactured by implementing ion doping to the IGZO semiconductor layer;
- wherein material of the first flat layer and the second flat layer is organic photoresist; material of the bottom gate isolation layer and the top gate isolation layer is Silicon Nitride, Silicon Oxide, or a combination of the two; material of the first bottom gate, the first top gate, the first source, the first drain, the second bottom gate, the second top gate, the second source and the second drain is a stack combination of one or more of molybdenum, titanium, aluminum and copper.

\* \* \* \* \*